United States Patent
Li et al.

(10) Patent No.: US 12,262,525 B2
(45) Date of Patent: Mar. 25, 2025

(54) SEMICONDUCTOR STRUCTURE PREPARATION METHOD, SEMICONDUCTOR STRUCTURE AND SEMICONDUCTOR MEMORY

(71) Applicant: CHANGXIN MEMORY TECHNOLOGIES, INC., Hefei (CN)

(72) Inventors: Xiaojie Li, Hefei (CN); Pan Yuan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 387 days.

(21) Appl. No.: 17/668,661

(22) Filed: Feb. 10, 2022

(65) Prior Publication Data
US 2023/0031509 A1  Feb. 2, 2023

Related U.S. Application Data

(63) Continuation of application No. PCT/CN2021/112845, filed on Aug. 16, 2021.

(30) Foreign Application Priority Data

Jul. 27, 2021 (CN) .......................... 202110853063.1

(51) Int. Cl.
*H01L 21/00* (2006.01)
*H10B 12/00* (2023.01)

(52) U.S. Cl.
CPC ............ *H10B 12/09* (2023.02); *H10B 12/31* (2023.02); *H10B 12/34* (2023.02); *H10B 12/50* (2023.02)

(58) Field of Classification Search
CPC ........ H10B 12/09; H10B 12/50; H10B 12/31; H10B 12/34
See application file for complete search history.

(56) References Cited

U.S. PATENT DOCUMENTS 8,709,854 B2  4/2014  Chuang
8,822,287 B2  9/2014  Kim
(Continued)

FOREIGN PATENT DOCUMENTS

CN  103390625 A  11/2013
CN  103972177 B  3/2018
(Continued)

OTHER PUBLICATIONS

Supplementary European Search Report in the European application No. 21948687.5, mailed on Jan. 29, 2024, 8 pages.

*Primary Examiner* — Richard A Booth
(74) *Attorney, Agent, or Firm* — Kilpatrick Townsend & Stockton LLP

(57) ABSTRACT

Provided are a method for preparing a semiconductor structure, a semiconductor structure and a semiconductor memory. The method includes the following operations. An initial semiconductor structure is formed on a substrate. The initial semiconductor structure is etched to form an array area structure and a peripheral area structure including a peripheral area gate structure. An isolation wall surrounding the peripheral area gate structure is formed on the substrate where the peripheral area structure locates. A second dielectric layer is deposited on the peripheral area gate structure including the isolation wall and on the array area structure. The second dielectric layer, the first dielectric layer and the isolation wall are etched to form the semiconductor structure with a flat surface.

14 Claims, 12 Drawing Sheets

(56) References Cited

U.S. PATENT DOCUMENTS

| | | |
|---|---|---|
| 2003/0206447 A1 | 11/2003 | Tuan |
| 2012/0149185 A1 | 6/2012 | Kim |
| 2013/0049091 A1 | 2/2013 | Saino |
| 2013/0299886 A1 | 11/2013 | Chuang |
| 2014/0246724 A1 | 9/2014 | Jang |
| 2015/0200299 A1* | 7/2015 | Chen ................... H01L 29/167 438/285 |
| 2015/0278557 A1* | 10/2015 | Yasutomi ............. G06F 1/1684 361/679.3 |

FOREIGN PATENT DOCUMENTS

| | | |
|---|---|---|
| CN | 108598081 A | 9/2018 |
| CN | 105720058 B | 5/2019 |
| CN | 111968911 A | 11/2020 |
| CN | 111968985 A | 11/2020 |

* cited by examiner

SEMICONDUCTOR STRUCTURE PREPARATION METHOD, SEMICONDUCTOR STRUCTURE AND SEMICONDUCTOR MEMORY

CROSS-REFERENCE TO RELATED APPLICATIONS

The present application is a continuation application of International application of No. PCT/CN2021/112845, filed on Aug. 16, 2021, which claims priority to Chinese Patent Application No. 202110853063.1, filed on Jul. 27, 2021. The disclosures of International application of No. PCT/CN2021/112845 and Chinese Patent Application No. 202110853063.1 are hereby incorporated by reference in their entireties.

BACKGROUND

With the continuous development of the semiconductor technology, the structure of semiconductors becomes more and more complex. The same substrate is often divided into areas with different functions as required, and longitudinal structures of each area are different. Therefore, there is a height difference between semiconductor structures in each area, which brings difficulties to the processing of an integrated circuit.

In a semiconductor structure with a high-k metal gate (HKMG), the longitudinal structure becomes more complicated, and the height difference between the areas is enlarged. During processing, the surface structure of some areas of the semiconductor may be excessively eliminated, resulting in the risk of depression.

SUMMARY

The present disclosure relates, but is not limited, to a method for preparing a semiconductor structure, a semiconductor structure and a semiconductor memory.

The embodiments of the present disclosure provide a method for preparing a semiconductor structure, which may include the following operations.

An initial semiconductor structure is formed in a substrate.

The initial semiconductor structure is etched to form an array area structure and a peripheral area structure. Herein the array area structure and the peripheral area structure have different heights on the substrate; the peripheral area structure includes a peripheral area gate structure and the array area structure and the peripheral area structure respectively include a first dielectric layer.

An isolation wall surrounding the peripheral area gate structure is formed on the substrate where the peripheral area structure locates.

A second dielectric layer is deposited on the peripheral area gate structure including the isolation wall and on the array area structure.

The second dielectric layer, the first dielectric layer and the isolation wall are etched to form the semiconductor structure with a flat surface.

The embodiments of the present disclosure further provide a semiconductor structure, which is prepared by the method of the above solution.

The embodiments of the present disclosure further provide a semiconductor memory, which includes the semiconductor structure in the above solution.

DETAILED DESCRIPTION

For making the objectives, technical solutions, and advantages of the present disclosure clearer, the technical solutions of the disclosure will further be described below in combination with the drawings and the embodiments in detail. The described embodiments should not be considered as limits to the disclosure. All other embodiments obtained by those of ordinary skill in the art without creative work shall fall within the scope of protection of the disclosure.

"Some embodiments" involved in the following descriptions describes a subset of all possible embodiments. However, it can be understood that "some embodiments" may be the same subsets or different subsets of all the possible embodiments, and may be combined with each other without conflicts.

If the similar descriptions of "first/second" appear in the disclosure documents, the following descriptions will be added. Terms "first/second/third" involved in the following descriptions are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

Unless otherwise defined, all technological and scientific terms used in the present disclosure have the same meanings as those usually understood by those skilled in the art of the disclosure. The terms used in the present disclosure are only adopted to describe the embodiments of the disclosure and not intended to limit the disclosure.

In the process of manufacturing an integrated circuit, the same substrate is often divided into areas with different functions as required, and longitudinal structures of each area are different. Therefore, there is a height difference between semiconductor structures in each area. For example, the thickness of a gate oxide layer of a thin gate structure is less than that of a thick gate structure, and the thickness difference there between may be 30~40 Å (Angstrom). Thus, the height of the thin gate structure may be 20~30 Å less than that of the thick gate structure. In a semiconductor structure with a high-k metal gate (HKMG), the longitudinal structures become more complicated, and the height difference between the areas is enlarged, which may reach 12 nm (1 nm=10 Å). If the semiconductor structures with the height difference are processed directly, the semiconductor structures with lower height may be over-processed, resulting in the risk of depression.

Figure 1:
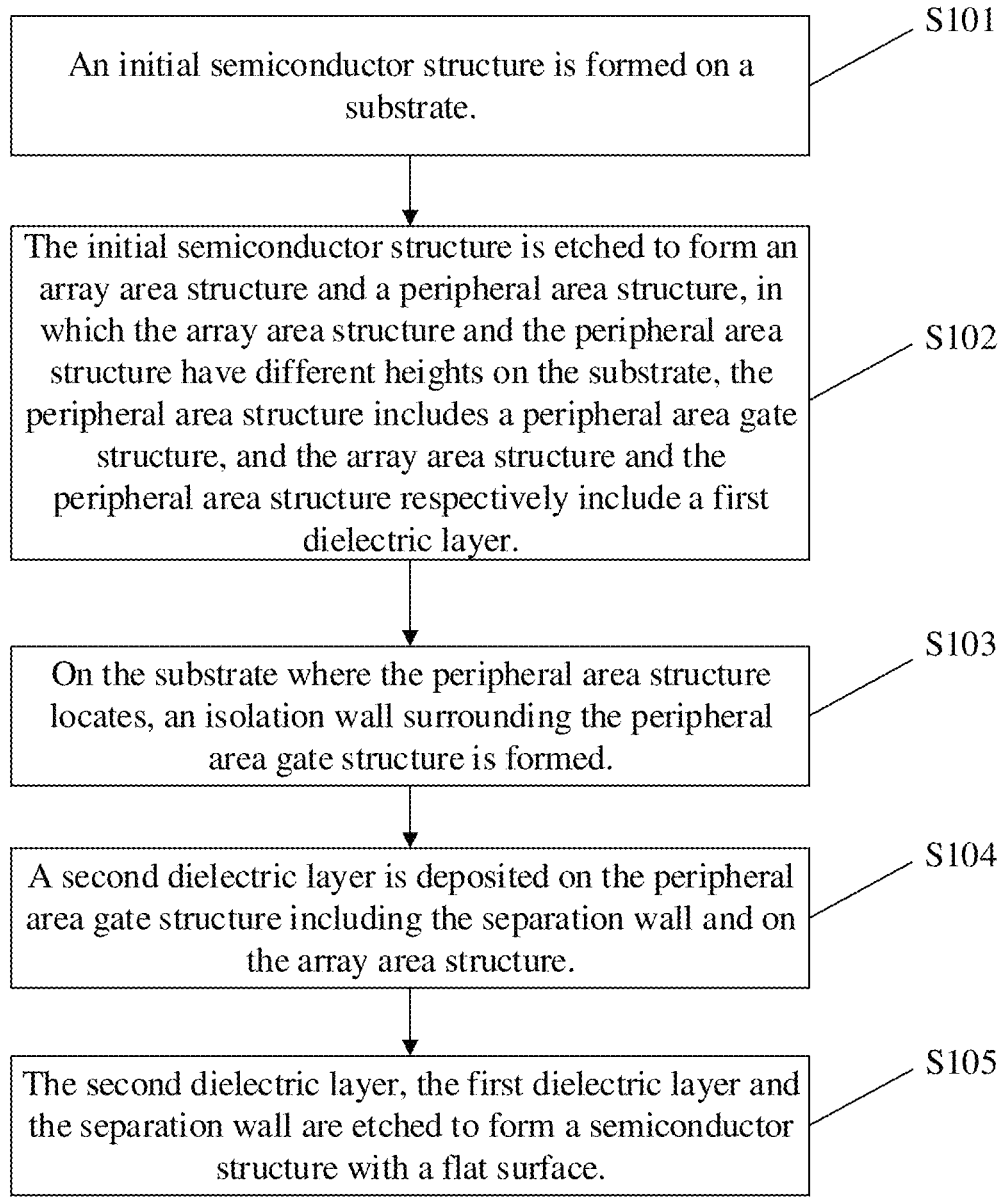
FIG. 1 is a first flowchart of a method for preparing a semiconductor structure according to an embodiment of the disclosure.

FIG. 1 is an optional flowchart of a method for preparing a semiconductor structure according to an embodiment of the disclosure, which will be described with reference to the steps shown in FIG. 1.

At S101, an initial semiconductor structure is formed in a substrate.

In the embodiment of the disclosure, the initial semiconductor structure may be firstly form on the substrate by a semiconductor device. The substrate is a wafer made of a semiconductor single crystal material, and usually is a single crystal silicon material.

Figure 2:
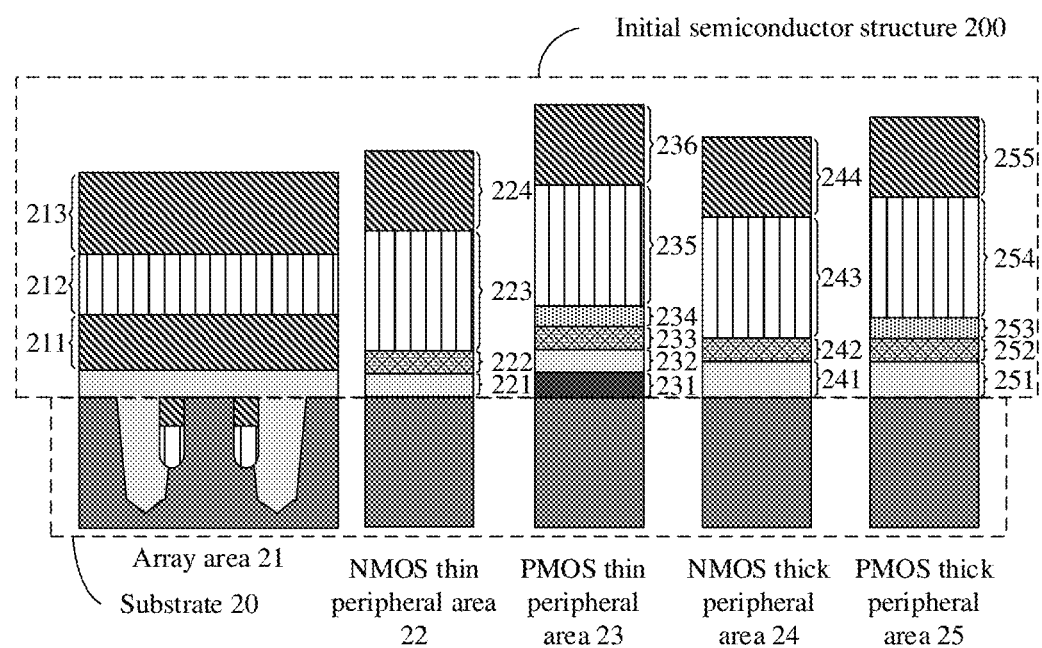
FIG. 2 is a first schematic diagram of a method for preparing a semiconductor structure according to an embodiment of the disclosure.

FIG. 2 is a diagrammatic cross-section of the initial semiconductor structure according to an embodiment of the disclosure. As shown in FIG. 2, the initial semiconductor structure 200 is formed on the substrate 20. According to different implementation functions, the substrate 20 is divided into an array area 21, an NMOS thin peripheral area 22, a PMOS thin peripheral area 23, an NMOS thick peripheral area 24 and a PMOS thick peripheral area 25. The initial semiconductor structure on the array area 21 includes a third dielectric layer 211, a conductive layer 212 and a first dielectric layer 213. The initial semiconductor structure on the NMOS thin peripheral area 22 includes a gate oxide layer 221, a high-k material layer 222, a conductive layer 223 and a first dielectric layer 224. The initial semiconductor structure on the thin PMOS peripheral area 23 includes a strained layer 231, a gate oxide layer 232, a high-k material layer 233, a work function layer 234, a conductive layer 235 and a first dielectric layer 236. The initial semiconductor structure on the NMOS thick peripheral area 24 includes a gate oxide layer 241, a high-k material layer 242, a conductive layer 243 and a first dielectric layer 244. The initial semiconductor structure on the PMOS thick peripheral area 25 includes a gate oxide layer 251, a high-k material layer 252, a work function layer 253, a conductive layer 254 and a first dielectric layer 255.

It is apparent that the initial semiconductor structures in different areas are not the same and have a height difference. For example, the initial semiconductor structures in the NMOS thin peripheral area 22, the PMOS thin peripheral area 23, the NMOS thick peripheral area 24 and the PMOS thick peripheral area 25 respectively include the high-k material layers 222, 233, 242 and 252, and the initial semiconductor structure in the array area 21 does not. The initial semiconductor structures in the PMOS thin peripheral area 23 and the PMOS thick peripheral area 25 respectively include work function layers 234 and 253, and the initial semiconductor structures in the array area 21, the NMOS thin peripheral area 22 and the NMOS thick peripheral area 24 do not. The initial semiconductor structure in the PMOS thin peripheral area 23 includes the strained layer 231, and other areas do not. The gate oxide layers 241 and 251 in the NMOS and PMOS thick peripheral areas 24 and 25 are thicker than the gate oxide layers 221 and 232 in the NMOS and PMOS thin peripheral areas 22 and 23.

In addition, the structures or the materials of the conductive layers 212, 223, 235, 243, and 254 in different areas may be different, which will also result in differences of heights of the initial semiconductor structures in different areas.

In the embodiment of the disclosure, the operation that the initial semiconductor structure 200 is formed on the substrate 20 by a semiconductor device may be completed through the following processes.

First, after the gate oxide layers 221, 232, 241 and 251 are deposited, a high-k material is deposited on the third dielectric layer 211 of the array area 21 and the gate oxide layers 221, 232, 241 and 251 of the peripheral areas 22, 23, 24 and 25. The high-k material on the third dielectric layer 211 is removed, thereby leaving the high-k material layers 222, 233, 242 and 252 of the peripheral areas 22, 23, 24 and 25.

Then, a conductive material is deposited and processed on the third dielectric layer 211 of the array area 21 and the high-k material layers 222, 233, 242 and 252 of the peripheral areas 22, 23, 24 and 25, thereby forming the conductive layers 212, 223, 235, 243 and 254 of the array area 21 and the peripheral areas 22, 23, 24 and 25.

Finally, the first dielectric layers 213, 224, 236, 244 and 255 are deposited on the conductive layers 212, 223, 235, 243 and 254 of the array area 21 and the peripheral areas 22, 23, 24 and 25, thereby forming the initial semiconductor structure 200.

In the embodiment of the disclosure, the deposition processes with a semiconductor device may be various processes such as diffusion, chemical vapor deposition (CVD), physical vapor deposition (PVD), etc., which is not limited here.

At S102, the initial semiconductor structure is etched to form an array area structure and a peripheral area structure. The array area structure and the peripheral area structure have different heights on the substrate. The peripheral area structure includes a peripheral area gate structure. The array area structure and the peripheral area structure respectively include a first dielectric layer.

In the embodiment of the disclosure, the initial semiconductor structure may be etched by a semiconductor device to form the array area structure and the peripheral area structure including the peripheral area gate structure. The array area structure and the peripheral area structure have different heights on the substrate. The array area structure and the peripheral area structure respectively include the first dielectric layer.

Figure 3:
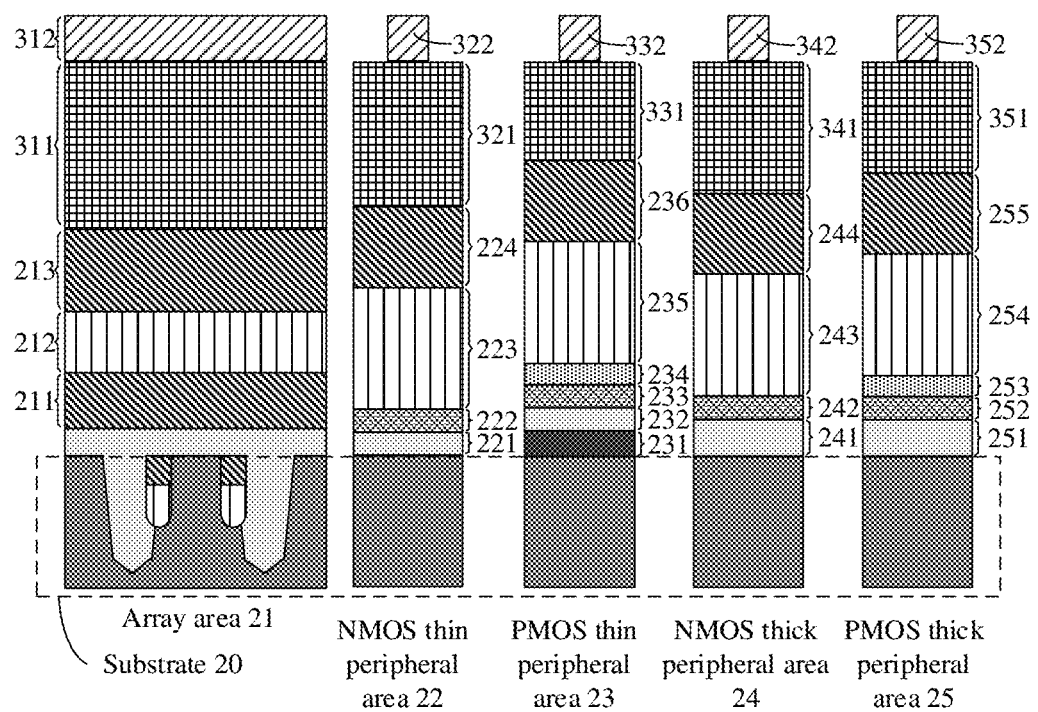
FIG. 3 is a second schematic diagram of a method for preparing a semiconductor structure according to an embodiment of the disclosure.

In the embodiment of the disclosure, before etching the initial semiconductor structure, it needs to form a mask layer and a patterned photoresist layer on the initial semiconductor structure by a semiconductor device. FIG. 3 is a diagrammatic cross-section after the mask layer and the patterned photoresist layer is formed, on the basis of FIG. 2. Taking FIG. 3 as an example, the mask layers 311, 321, 331, 341 and 351 are formed by a semiconductor device on the first dielectric layers 213, 224, 236, 244 and 255 in each area, and then the patterned photoresist layers 312, 322, 332, 342 and 352 are formed on the mask layers 311, 321, 331, 341 and 351 by a photo masking process, respectively. The mask layers 311, 321, 331, 341, and 351 are configured to cooperate with the formation of the photoresist layers 312, 322, 332, 342, and 352, such as increasing the adhesion of photoresist and preventing photoresist from penetrating downward.

It is to be noted that the photoresist layers 312, 322, 332, 342 and 352 are patterned and contain all plane pattern information of the semiconductor structures to be formed in subsequent processes in each area, so that the corresponding semiconductor structure can be manufactured in subsequent processes. For example, the photoresist layer 312 covers all the top sections of the array area 21, and the respective photoresist layers 322, 332, 342 and 352 only cover the middle parts of the top sections of the peripheral areas 22, 23, 24 and 25. Therefore, the semiconductor structures, formed in subsequent processes, of the array area 21 and the peripheral areas 22, 23, 24 and 25 are different.

The mask layers may be formed by diffusion, CVD, PVD, spin-on coating and other processes, and is not limited here.

Figure 4:
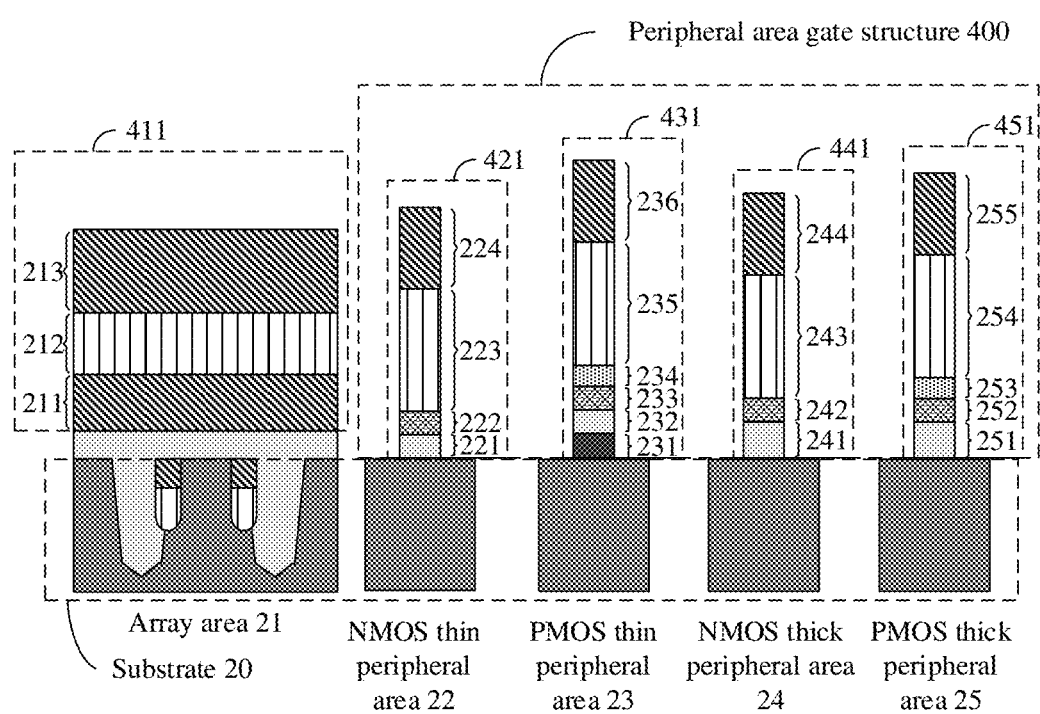
FIG. 4 is a third schematic diagram of a method for preparing a semiconductor structure according to an embodiment of the disclosure.

In the embodiment of the disclosure, after the mask layers and the patterned photoresist layers are formed, the mask layers may be etched at least once by a semiconductor device based on the patterned photoresist layers to form the array area structure and the peripheral area structure. FIG. 4 is a diagrammatic cross-section after etching based on FIG. 3. Taking FIG. 4 as an example, the array area 21 and the middle sections of the peripheral areas 22, 23, 24 and 25 are covered with the photoresist layers, and are protected by the photoresist layers. The parts covered by the photoresist layers remain, and the parts exposed by the photoresist layers are etched away. Hence, parts of the first dielectric layers 224, 236, 244, and 255, that are not covered by the photoresist layers 322, 332, 342, and 352, are etched away in subsequent etching processes, that is, parts of both sides of the sections of the peripheral areas 22, 23, 24, and 25, which are not protected by the photoresist layers 322, 332, 342, and 352, are etched away till the top of the substrate 20. Thus, as shown in FIG. 4, the peripheral area gate structure 400 is formed in the peripheral areas 22, 23, 24 and 25.

It is to be noted that in the process of forming the peripheral area gate structure 400 by the semiconductor device, different recipe may be correspondingly employed for etching several times according to the materials of each layer in the peripheral areas 22, 23, 24 and 25.

At S103, an isolation wall surrounding the peripheral area gate structure is formed on the substrate of the peripheral area structure.

In the embodiment of the disclosure, after the peripheral area gate structure is formed, the isolation wall, which surrounds the peripheral area gate structure on the substrate of the peripheral area structure, may be formed by a semiconductor device. The isolation wall is configured to insulate and protect the peripheral area gate structure.

Figure 5:
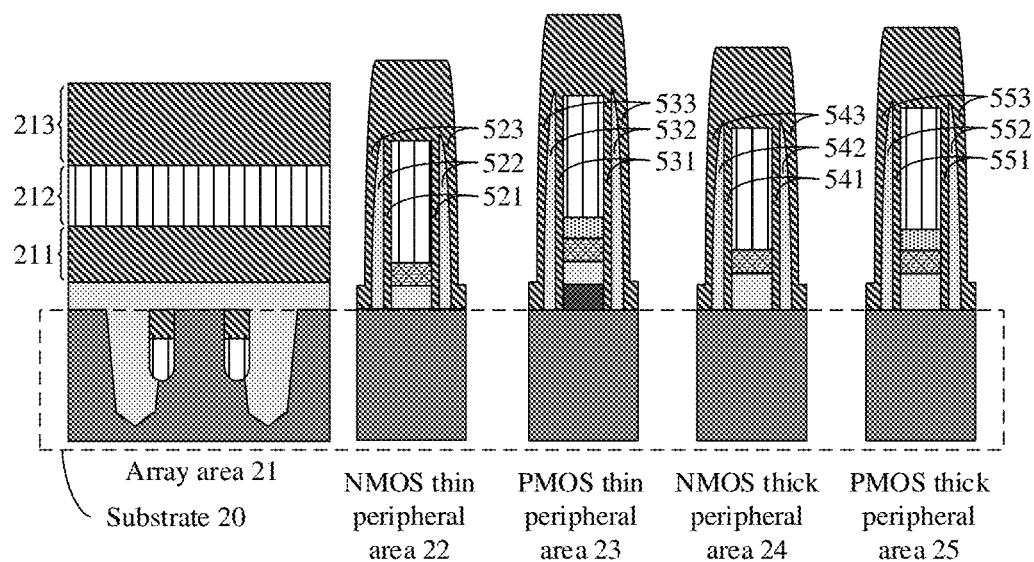
FIG. 5 is a fourth schematic diagram of a method for preparing a semiconductor structure according to an embodiment of the disclosure.

In the embodiment of the disclosure, the structure of the isolation wall may be an N—O—N (SiN—SiO—SiN) structure, namely, a silicon nitride-silicon oxide-silicon nitride structure. FIG. 5 is a diagrammatic cross-section after the isolation wall is formed on the basis of FIG. 4. Taking FIG. 5 as an example, the isolation walls of the N—O—N structure surrounding the peripheral area gate structure on the peripheral areas 22, 23, 24 and 25 are formed. The isolation walls respectively include first silicon nitride layers 521, 531, 541 and 551, silicon oxide layers 522, 532, 542 and 552, and second silicon nitride layers 523, 533, 543 and 553. The peripheral area gate structure may be surrounded with a semiconductor device by firstly depositing the first silicon nitride layers 521, 531, 541 and 551; then depositing the silicon oxide layers 522, 532, 542 and 552 surrounding the first silicon nitride layers 521, 531, 541 and 551; and at last, depositing the second silicon nitride layers 523, 533, 543 and 553 surrounding the silicon oxide layers 522, 532, 542 and 552. Thus, the isolation wall of the N—O—N structure is formed.

In the embodiment of the disclosure, the deposition of the isolation wall may executed by a semiconductor device with any of various processes such as diffusion, CVD and PVD, which is not limited here.

At S104, a second dielectric layer is deposited on the peripheral area gate structure including the isolation wall and on the array area structure.

In the embodiment of the disclosure, the second dielectric layer may be deposited on the peripheral area gate structure including the isolation wall and on the array area structure by a semiconductor device.

Figure 6:
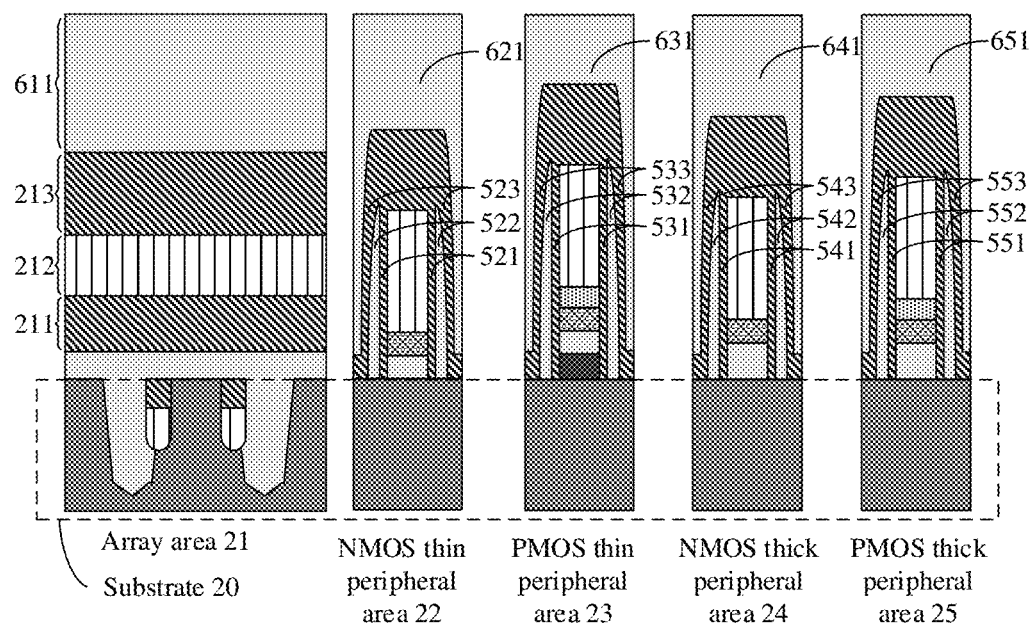
FIG. 6 is a fifth schematic diagram of a method for preparing a semiconductor structure according to an embodiment of the disclosure.

FIG. 6 is a diagrammatic cross-section after the second dielectric layer is deposited on the basis of FIG. 5. Taking FIG. 6 as an example, second dielectric layers 611, 621, 631, 641 and 651 are deposited by a semiconductor device on the array area structure of the array area 21 and outside the isolation walls on the peripheral areas 22, 23, 24 and 25. The second dielectric layers 611, 621, 631, 641 and 651 may be used as consumable materials to protect the semiconductor structure below them in subsequent consuming processes, and as isolation areas among the areas to insulate the areas.

In the embodiment of the disclosure, the material of the second dielectric layer may be silicon oxide. The deposition of the second dielectric layer may be executed by a semiconductor device with any of various processes such as diffusion, CVD and PVD, which is not limited here.

At S105, the second dielectric layers, the first dielectric layers and the isolation wall are etched to form a semiconductor structure with a flat surface.

In the embodiment of the disclosure, the second dielectric layers, the first dielectric layers and the isolation wall may be etched by a semiconductor device to form the semiconductor structure with a flat surface, that is, the height of the structure of each area on the substrate is consistent and there is no depression.

In the embodiment of the disclosure, when the material of the first dielectric layer is silicon nitride, the material of the second dielectric layer is silicon oxide, and the isolation wall is the silicon nitride-silicon oxide-silicon nitride structure, the second dielectric layer, the first dielectric layer and the isolation wall may be etched by the semiconductor device in a manner that the etching rate ratio of silicon oxide to silicon nitride is 1:1. The etching rate ratio of silicon oxide to silicon nitride is 1:1, which means that the silicon nitride material and silicon oxide material are consumed at the same rate in the etching process. In this way, in the etching process, the second dielectric layer, the first dielectric layer and the isolation wall are consumed at the same rate, so that surfaces are always flush, and finally the semiconductor structure with a flat surface is formed.

In the embodiment of the disclosure, in order to achieve the etching rate ratio of silicon oxide to silicon nitride of 1:1, a specific recipe may be adopted for etching. The specific recipe may include the following operations. A first gas introduced into a reaction chamber at a first flow rate and a second gas introduced into the reaction chamber at a second flow rate are as an etching gas. In an environment of a first pressure and a first temperature, the etching gas is treated to form plasma. The second dielectric layer, the first dielectric layer and the isolation wall are etched for a first duration with the plasma. The first gas may be carbon tetrafluoride, and the first flow rate is 80-120 sccm (standard milliliter/minute); the second gas may be nitrogen, and the second flow rate is 180-220 sccm. The first pressure is 3-7 torr. The first temperature is 20-50 degrees centigrade, which goes downward in the first duration. The first duration is 20-40 seconds.

Figure 7:
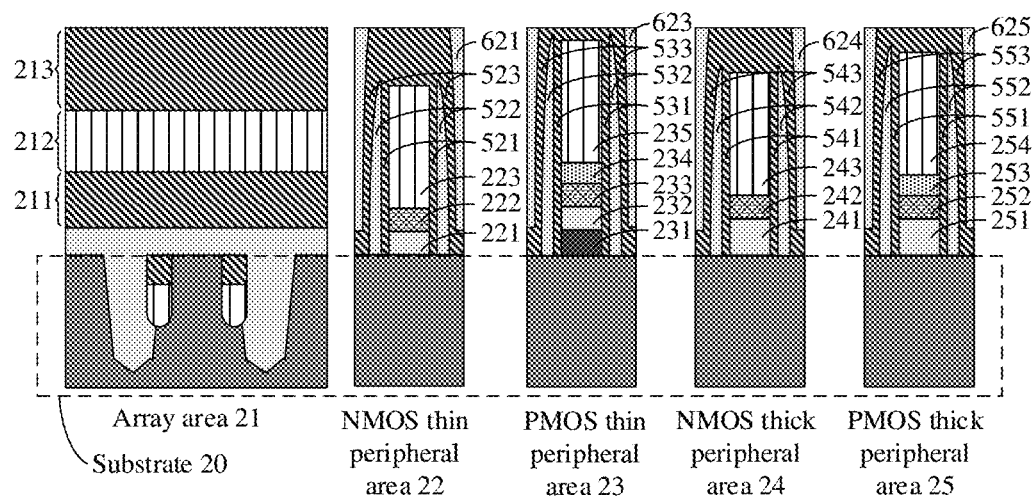
FIG. 7 is a sixth schematic diagram of a method for preparing a semiconductor structure according to an embodiment of the disclosure.

In the embodiment of the disclosure, due to the fact that there is a height difference between the structures of each area on the substrate, the lowest height of each area structure on the substrate may be taken as an etching endpoint by the semiconductor device, or the surface of the first dielectric layer in the array area structure may be taken as the etching endpoint by the semiconductor device, thus forming the semiconductor structure with a flat surface. FIG. 7 is a diagrammatic cross-section after etching is executed on the basis of FIG. 6. Taking FIG. 7 as an example, the surface of the first dielectric layer 213 in the array area 21 is taken as the etching endpoint in the semiconductor device, and the semiconductor structures in the peripheral areas 22, 23, 24 and 25 are etched to be flush with the etching endpoint.

It is to be understood that the peripheral area gate structure is formed in the semiconductor device first, and the second dielectric layer, the first dielectric layer and the isolation wall are deposited for protection, so that excessive elimination of a semiconductor surface structure can be avoided and the risk of depression is reduced. Meanwhile, the second dielectric layer, the first dielectric layer and the isolation wall are etched with a specific etching rate ratio, so that the surface of the formed semiconductor structure is guaranteed to be flat.

Figure 8:
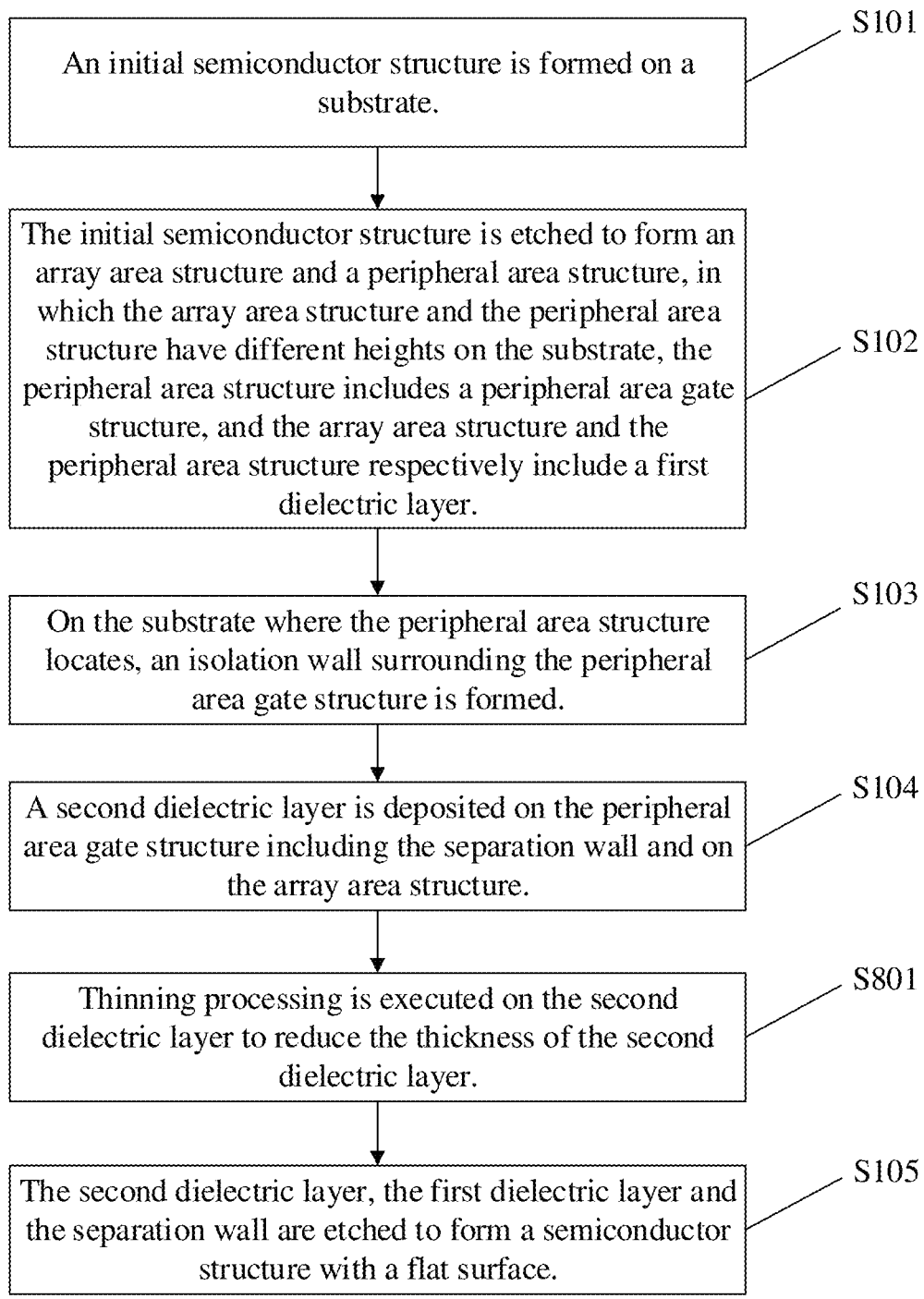
FIG. 8 is a second flow chart of a method for preparing a semiconductor structure according to an embodiment of the disclosure.

In some embodiments of the disclosure, S801 shown in FIG. 8 is further included between S104 and S105 shown in FIG. 1, which will be explained with reference to each step.

At S801, thinning processing is executed to the second dielectric layer to reduce the thickness of the second dielectric layer.

Figure 9:
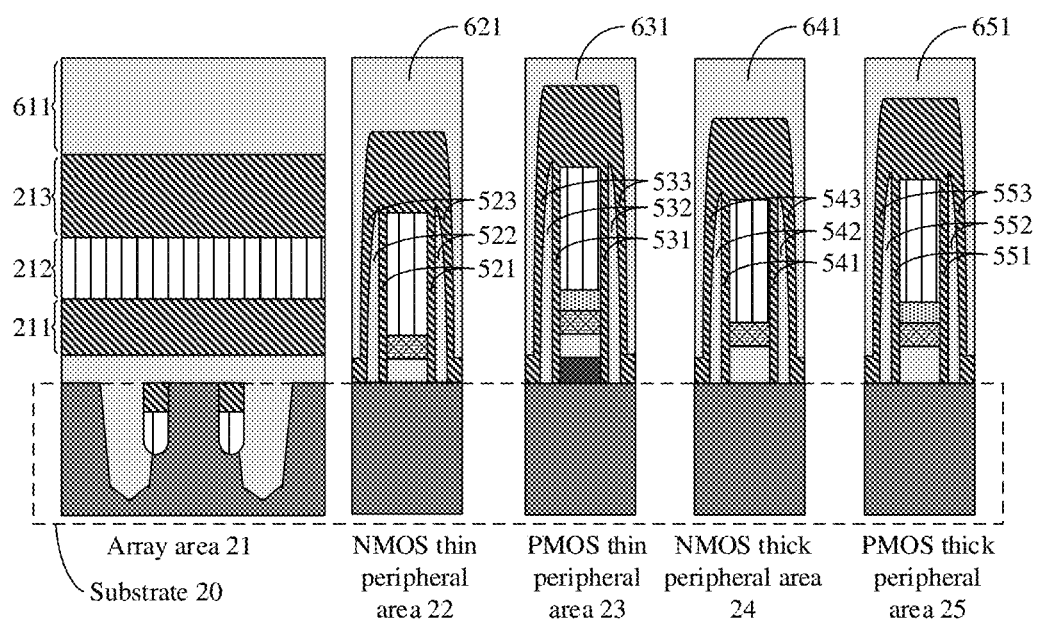
FIG. 9 is a seventh schematic diagram of a method for preparing a semiconductor structure according to an embodiment of the disclosure.

In the embodiment of the disclosure, before etching the second dielectric layers, the first dielectric layers and the isolation wall, thinning processing to the second dielectric layers may be also performed in a semiconductor device to reduce the thickness of the second dielectric layer. The thinning processing may be completed with a chemical mechanical polishing (CMP) process, which can make the surface of the second dielectric layer flatter. FIG. 9 is a diagrammatic cross-section after the thinning processing on the basis of FIG. 6. Taking FIG. 9 as an example, the thicknesses of the second dielectric layers 611, 621, 631, 641 and 651 is reduced in FIG. 9 compared with FIG. 6.

It is to be understood that the operation that the thinning processing is executed on the second dielectric layers before etching can save time and cost for subsequent etching.

Figure 10:
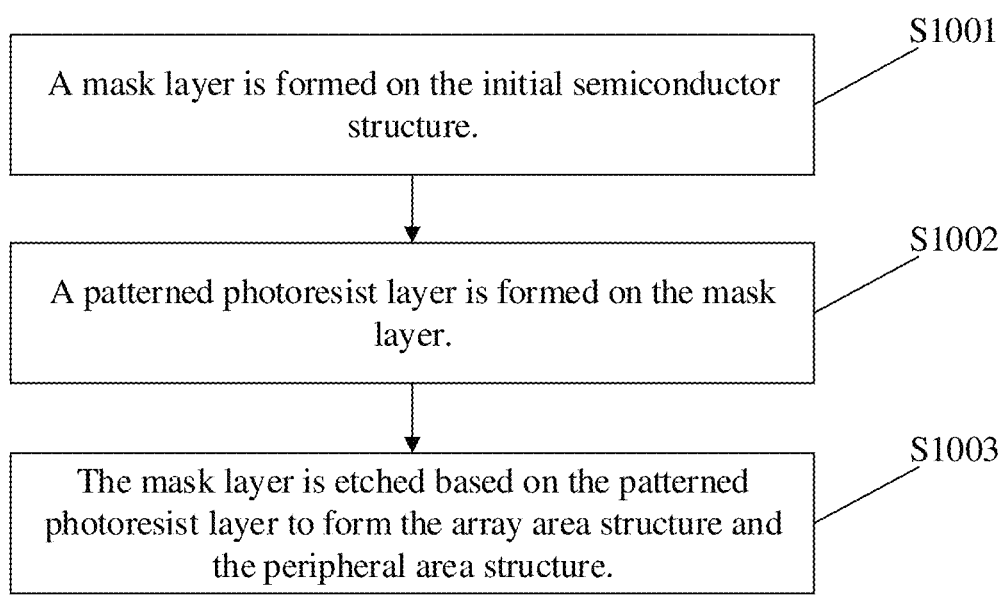
FIG. 10 is a third flow chart of a method for preparing a semiconductor structure according to an embodiment of the disclosure.

In some embodiments of the disclosure, S102 shown in FIG. 1 may be implemented with S1001 to S1003 shown in FIG. 10, which will be explained with reference to each step.

At S1001, a mask layer is formed on the initial semiconductor structure.

In the embodiment of the disclosure, with a semiconductor device the mask layer may be formed on the initial semiconductor structure first. The mask layer is configured to cooperate with the formation of the photoresist layer, such as increasing the adhesion of photoresist and preventing photoresist from penetrating downward.

In the embodiment of the disclosure, the mask layer may be formed by diffusion, CVD, PVD, spin-on coating or any other processes, which are not limited here.

At S1002, the patterned photoresist layer is formed on the mask layer.

In the embodiment of the disclosure, the patterned photoresist layer on the mask layer may be formed by a photo masking process by a semiconductor device. The photoresist layer is patterned and includes all desired pattern information of the semiconductor structures to be formed in subsequent processes, so that the needed semiconductor structure can be manufactured in subsequent processes.

At S1003, the mask layer is etched based on the patterned photoresist layer to form the array area structure and the peripheral area structure.

In the embodiment of the disclosure, after the mask layer and the patterned photoresist layer are formed with the semiconductor device, the mask layer may be etched at least once based on the patterned photoresist layer to form the array area structure and the peripheral area structure.

In some embodiments of the disclosure, the material of a first dielectric layer includes silicon nitride, the material of a second dielectric layer includes silicon oxide, and the isolation wall includes the silicon nitride-silicon oxide-silicon nitride structure. Thus, when etching is executed at the etching rate ratio of silicon oxide to silicon nitride of 1:1, the first dielectric layer, the second dielectric layer and the isolation wall are consumed at the same rate, so that surfaces are always flush.

In some embodiments of the disclosure, the peripheral area gate structure at least includes a first NMOS structure, a first PMOS structure, a second NMOS structure and a second PMOS structure. The array area structure, the first NMOS structure, the first PMOS structure, the second NMOS structure and the second PMOS structure may all have different heights on the substrate. Taking FIG. 4 as an example, the first NMOS structure 421 is on the NMOS thin peripheral area 22. The first PMOS structure 431 is on the PMOS thin peripheral area 23. The second NMOS structure 441 is on the NMOS thick peripheral area 24. The second PMOS structure 451 is on the PMOS thick peripheral area 25. The array area structure 411 is on the array area 21. The array area structure 411, the first NMOS structure 421, the first PMOS structure 431, the second NMOS structure 441 and the second PMOS structure 451 may all have different heights on the substrate.

In some embodiments of the disclosure, S105 in FIG. 1 may be implemented by S1051, which will be explained with reference to each operation.

At S1051, the lowest height on the substrate among the heights of the array area structure, the first NMOS structure including the isolation wall, the first PMOS structure including the isolation wall, the second NMOS structure including the isolation wall and the second PMOS structure including the isolation wall is taken as the etching endpoint to form the semiconductor structure with a flat surface.

In the embodiment of the disclosure, a semiconductor device may take the lowest height on the substrate among the heights of the array area structure, the first NMOS structure including the isolation wall, the first PMOS structure including the isolation wall, the second NMOS structure including the isolation wall and the second PMOS structure including the isolation wall as the etching endpoint to form the semiconductor structure with a flat surface.

In some embodiments of the disclosure, S105 in FIG. 1 may be implemented by S1052, which will be explained with reference to each operation.

At S1052, the surface of the first dielectric layer in the array area structure is taken as the etching endpoint to form the semiconductor structure with a flat surface.

In the embodiment of the disclosure, the semiconductor device may take the surface of the first dielectric layer in the array area structure as the etching endpoint to form the semiconductor structure with a flat surface.

In some embodiments of the disclosure, S105 in FIG. 1 may be implemented by S1053, which will be explained with reference to each operation.

At S1053, the second dielectric layer, the first dielectric layer and the isolation wall are etched at an etching rate ratio of silicon oxide to silicon nitride.

In the embodiment of the disclosure, the second dielectric layer, the first dielectric layer and the isolation wall may be etched with the etching rate ratio of silicon oxide to silicon nitride by a semiconductor device, so as to keep the surface of the semiconductor structure to be flat.

In some embodiments of the disclosure, S105 in FIG. 1 may be implemented by S1054, which will be explained with reference to each operation.

At S1054, the second dielectric layer, the first dielectric layer and the isolation wall are etched for the first duration under an environment with a first pressure and a first temperature by using an etching gas including the first gas and the second gas. The first gas is introduced into a reaction chamber at the first flow rate, and the second gas is introduced into the reaction chamber at the second flow rate.

In the embodiment of the disclosure, a semiconductor device may introduce the first gas into the reaction chamber at the first flow rate and introduce the second gas into the reaction chamber at the second flow rate as the etching gas. Under the environment of the first pressure and the first temperature, the etching gas is subjected to plasma to form Plasma. The second dielectric layer, the first dielectric layer and the isolation wall are etched for the first time by using the plasma.

In some embodiments of the disclosure, the etching rate ratio of silicon oxide to silicon nitride is 1:1. In this way, when the first dielectric layer of the silicon nitride material, the second dielectric layer of the silicon oxide material and the isolation wall of the silicon nitride-silicon oxide-silicon nitride structure are etched in the semiconductor device, the surface of the semiconductor structure can be kept flat.

In some embodiments of the disclosure, the first gas includes carbon tetrafluoride, and the first flow rate is 80-120 standard milliliter/minute; the second gas includes nitrogen, and the second flow rate is 180-220 standard milliliter/minute; the first pressure is 3-7 torr, the first temperature is 20-50 degrees centigrade and shows a downward trend in the first time, which is 20-40 seconds.

In some embodiments of the present disclosure, the array area structure further includes a third dielectric layer. The peripheral area structure also includes a high-k layer and a gate oxide layer. The array area structure and the peripheral area structure respectively further include: a conductive layer. Taking FIG. 4 as an example, the array area structure 411 includes the third dielectric layer 211. The peripheral area structures in the peripheral areas 22, 23, 24 and 25 respectively include the high-k material layers 222, 233, 242 and 252 and the gate oxide layers 221, 232, 241 and 251. The array area structure 411 and the peripheral area structures also respectively include the conductive layers 212, 223, 235, 243 and 254 formed by various conductive materials.

In some embodiments of the disclosure, the first PMOS structure further includes a work function layer and a strained layer, and the second PMOS structure further includes a work function layer. Taking FIG. 4 as an example, the first PMOS structure 431 is formed on the PMOS thin peripheral area 23 and further includes the work function layer 234 and the strained layer 231. The second PMOS structure 451 is formed on the PMOS thick peripheral area 25 and further includes the work function layer 253.

In some embodiments of the disclosure, the material of the conductive layer includes one or more of tungsten, titanium nitride, polysilicon or lanthanum oxide. The material of the third dielectric layers includes silicon nitride. The material of the gate oxide layer includes silicon oxide. The material of the work function layer includes alumina. The material of the strained layer includes silicon germanium.

It is to be noted that the conductive layers in different areas may have different structures or materials, which will also bring height differences to the initial semiconductor structures in different areas.

In some embodiments of the disclosure, the first dielectric layer is deposited by a heat treatment process. The second dielectric layer is a spin-on coating dielectric layer.

Figure 11:
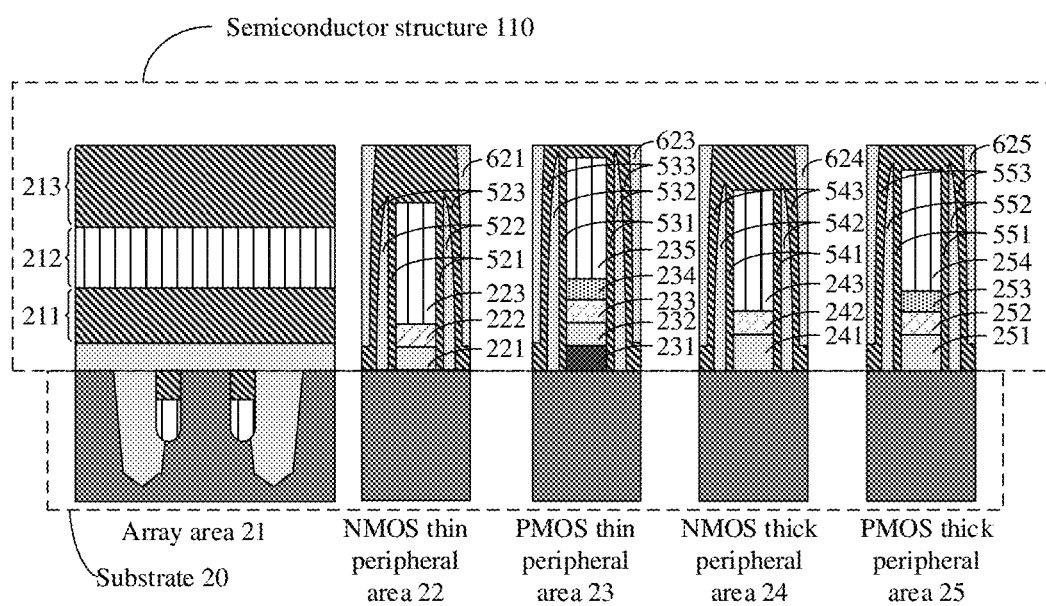
FIG. 11 is a diagrammatic cross-section of a semiconductor structure according to an embodiment of the disclosure.

The embodiments of the disclosure further provide a semiconductor structure 110, as shown in FIG. 11. The semiconductor structure 110 is formed by the preparation method provided by the above embodiments. Accordingly, excessive elimination of the semiconductor surface structure can be avoided, and the risk of recess is reduced. Meanwhile, etching is executed with a specific etching rate ratio, so that the surface of the formed semiconductor structure 110 is guaranteed to be flat.

Figure 12:
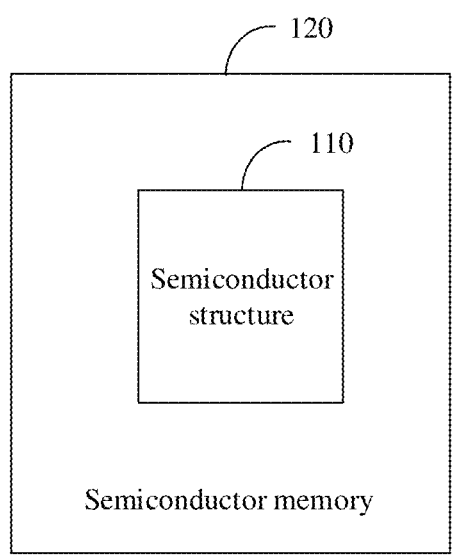
FIG. 12 is a structural diagram of a semiconductor memory according to an embodiment of the disclosure.

The embodiments of the present disclosure further provide a semiconductor memory 120. As shown in FIG. 12, the semiconductor memory 120 at least includes the semiconductor structure 110 shown in FIG. 11.

In some embodiments of the disclosure, the semiconductor memory 120 shown in FIG. 12 at least includes a dynamic random access memory (DRAM).

It is to be noted that the terms "include", "comprise" or any other variations thereof in the present disclosure are intended to cover a non-exclusive inclusion, such that a process, method, article or equipment including a series of elements not only includes those elements, but also includes other elements that are not explicitly listed, or includes elements inherent to the process, method, article or device. Under the condition of no more limitations, it is not excluded that additional identical elements further exist in the process, method, article or device including the element and defined by a sentence "including a . . . ".

The serial numbers of the embodiments of the disclosure are merely for description and do not represent the advantages or disadvantages of the embodiments. The methods disclosed in several method embodiments provided in the present disclosure may be arbitrarily combined without conflict to obtain a new method embodiment. The characteristics disclosed in several product embodiments provided in the present disclosure may be arbitrarily combined without conflict to obtain a new product embodiment. The characteristics disclosed in the several method or device embodiments provided in the present disclosure may be arbitrarily combined without conflict to obtain a new method embodiment or device embodiment.

The above is only the specific embodiment of the present disclosure and not intended to limit the scope of protection of the present disclosure. Any changes or replacements apparent to those skilled in the art within the technical scope disclosed by the disclosure shall fall within the scope of protection of the present disclosure. Therefore, the scope of protection of the present disclosure shall be subjected to the scope of protection of the claims.

INDUSTRIAL PRACTICABILITY

The embodiments of the present disclosure provide a method for preparing a semiconductor structure, a semiconductor structure and a semiconductor memory. The method includes the following operations. An initial semiconductor structure is formed in a substrate. The initial semiconductor structure is etched to form an array area structure and a peripheral area structure including a peripheral area gate structure. On the substrate where the peripheral area structure locates, an isolation wall surrounding the peripheral area gate structure is formed. A second dielectric layer is deposited on the peripheral area gate structure including the isolation wall and on the array area structure. The second dielectric layer, a first dielectric layer and the isolation wall are etched to form a semiconductor structure with a flat surface. Thus, the peripheral area gate structure is formed first, and the second dielectric layer, the first dielectric layer and the isolation wall are deposited for protection, so that excessive elimination of the semiconductor surface structure can be avoided, and the risk of depression is reduced.

The invention claimed is:

1. A method for preparing a semiconductor structure, comprising:
   forming an initial semiconductor structure on a substrate;
   etching the initial semiconductor structure to form an array area structure and a peripheral area structure, heights of the array area structure and the peripheral area structure on the substrate being different, the peripheral area structure comprising a peripheral area gate structure, and the array area structure and the peripheral area structure respectively comprising a first dielectric layer, wherein the peripheral area gate structure at least comprises a first NMOS structure, a first PMOS structure, a second NMOS structure and a second PMOS structure, the peripheral area structure further comprises a gate oxide layer, a strained layer is only formed in the first PMOS structure and directly below the gate oxide layer, a material of the strained layer comprises silicon germanium;
   forming an isolation wall surrounding the peripheral area gate structure on the substrate where the peripheral area structure locates;
   depositing a second dielectric layer on the peripheral area gate structure comprising the isolation wall and on the array area structure; and
   etching the second dielectric layer, the first dielectric layer and the isolation wall to form the semiconductor structure with a flat surface, or
   wherein performing thinning processing to the second dielectric layer to reduce a thickness of the second dielectric layer and then etching the second dielectric layer, the first dielectric layer and the isolation wall to form the semiconductor structure with a flat surface.

2. The method of claim 1, wherein etching the initial semiconductor structure to form the array area structure and the peripheral area structure comprises:
   forming a mask layer on the initial semiconductor structure;
   forming a patterned photoresist layer on the mask layer; and
   etching the mask layer and the initial semiconductor structure based on the patterned photoresist layer to form the array area structure and the peripheral area structure.

3. The method of claim 1, wherein,
   a material of the first dielectric layer comprises silicon nitride;
   a material of the second dielectric layer comprises silicon oxide; and
   the isolation wall comprises a silicon nitride-silicon oxide-silicon nitride structure.

4. The method of claim 1, wherein
   heights of the array area structure, the first NMOS structure, the first PMOS structure, the second NMOS structure and the second PMOS structure on the substrate are different.

5. The method of claim 1, wherein etching the second dielectric layer, the first dielectric layer and the isolation wall to form the semiconductor structure with a flat surface comprises:
   taking a lowest height on the substrate among heights of the array area structure, the first NMOS structure comprising a first sub-isolation wall, the first PMOS structure comprising a second sub-isolation wall, the second NMOS structure comprising a third sub-isolation wall and the second PMOS structure comprising a fourth sub-isolation wall as an etching endpoint to form the semiconductor structure with a flat surface.

6. The method of claim 1, wherein etching the second dielectric layer, the first dielectric layer and the isolation wall to form the semiconductor structure with a flat surface further comprises:
   taking a surface of the first dielectric layer in the array area structure as an etching endpoint to form the semiconductor structure with a flat surface.

7. The method of claim 3, wherein etching the second dielectric layer, the first dielectric layer and the isolation wall comprises:
   etching the second dielectric layer, the first dielectric layer and the isolation wall with an etching rate ratio of silicon oxide to silicon nitride.

8. The method of claim 7, wherein etching the second dielectric layer, the first dielectric layer and the isolation wall with the rate ratio of silicon oxide to silicon nitride comprises:
   etching the second dielectric layer, the first dielectric layer and the isolation wall for a first duration under an environment of a first pressure and a first temperature by using an etching gas comprising a first gas and a second gas;
   wherein the first gas is introduced into a reaction chamber at a first flow rate, and the second gas is introduced into the reaction chamber at a second flow rate.

9. The method of claim 7, wherein the rate ratio is 1:1.

10. The method of claim 8, wherein,
    the first gas comprises carbon tetrafluoride, and the first flow rate is 80-120 standard milliliter/minute;
    the second gas comprises nitrogen, and the second flow rate is 180-220 standard milliliter/minute;
    the first pressure is 3-7 torr;
    the first temperature is 20-50 centigrade degrees and the first temperature goes downward in the first duration; and
    the first duration is 20-40 seconds.

11. The method of claim 4, wherein,
    the array area structure further comprises a third dielectric layer;
    the peripheral area structure further comprises a high-k layer; and
    the array area structure and the peripheral area structure further respectively comprise a conductive layer.

12. The method of claim 11, wherein the first PMOS structure and the second PMOS structure further comprises a work function layer.

13. The method of claim 12, wherein
a material of the conductive layer comprises tungsten, titanium nitride, polysilicon or lanthanum oxide;
a material of the third dielectric layer comprises silicon nitride;
a material of the gate oxide layer comprises silicon oxide; and
a material of the work function layer comprises alumina.

14. The method of claim 1, wherein
the first dielectric layer is deposited by a heat treatment process; and
the second dielectric layer is a spin-on coating dielectric layer.

* * * * *